(12) United States Patent
Crane, Jr. et al.

(10) Patent No.: US 6,734,546 B2
(45) Date of Patent: May 11, 2004

(54) MICRO GRID ARRAY SEMICONDUCTOR DIE PACKAGE

(75) Inventors: Stanford W. Crane, Jr., Santa Clara, CA (US); Vicente D. Alcaria, Richmond, CA (US); Myoung-Soo Jeon, Fremont, CA (US)

(73) Assignee: Silicon Bandwidth, Inc., San Jose, CA (US)

( * ) Notice: Subject to any disclaimer, the term of this patent is extended or adjusted under 35 U.S.C. 154(b) by 0 days.

(21) Appl. No.: 10/082,174

(22) Filed: Feb. 26, 2002

(65) Prior Publication Data

US 2003/0162319 A1 Aug. 28, 2003

(51) Int. Cl.⁷ .............................................. H01L 23/48
(52) U.S. Cl. ...................... 257/692; 257/704; 257/720
(58) Field of Search .......................... 438/106; 257/692, 257/696, 700, 704, 706, 713, 720; 361/704, 713, 719, 720

(56) References Cited

U.S. PATENT DOCUMENTS

| | | | |
|---|---|---|---|
| 4,839,716 A | 6/1989 | Butt | |
| 4,839,717 A | * 6/1989 | Phy et al. | 257/692 X |
| 5,753,857 A | 5/1998 | Choi | |
| 6,339,191 B1 | * 1/2002 | Crane et al. | 257/692 X |
| 2001/0040792 A1 | 11/2001 | Crane, Jr., et al. | |

FOREIGN PATENT DOCUMENTS

| | | |
|---|---|---|
| EP | 0 268 181 A1 | 5/1998 |
| GB | 2 011 727 A | 7/1979 |

* cited by examiner

*Primary Examiner*—Long Pham
*Assistant Examiner*—(Vikki) Hoa B. Trinh
(74) *Attorney, Agent, or Firm*—Morgan, Lewis & Bockius LLP

(57) ABSTRACT

A micro grid array semiconductor die package includes a housing defining a cavity for holding at least one semiconductor die, said housing including a plurality of insulative side walls, each of said side walls having a bottom surface and an interior wall including a top surface, and an end plate joined to said side walls; and a plurality of substantially straight conductive leads extending through at least one of said side walls, each of said conductive leads including an internal lead section extending into the cavity from the top surface of the interior wall and a external lead section extending externally from said at least one bottom surface of said side wall.

13 Claims, 21 Drawing Sheets

MICRO GRID ARRAY SEMICONDUCTOR DIE PACKAGE

BACKGROUND OF THE INVENTION

1. Field of the Invention

The present invention relates to a grid array semiconductor die package having leads that extend from the bottom of the side walls, and methods for making and using the die package.

2. Discussion of the Prior Art

A semiconductor die or chip is an electrical component on which a microcircuit is built. The microcircuits can be interconnected together on the printed circuit board to form larger electrical circuits for use in radios, televisions, compact disk players, and computers, to name just a few. Because the semiconductor die is fragile, it is encased in a semiconductor die package.

The semiconductor die package includes a housing that holds the semiconductor die and conductive leads or pins that extend from the housing. The conductive leads are electrically connected to the semiconductor die within the housing. The outside ends of the leads are soldered to conductive paths on the printed circuit board. This secures the semiconductor die package to the printed circuit board and permits electrical signals to pass between the semiconductor die and other components on the printed circuit board.

As semiconductors become faster, more complex and smaller, the demand on packaging technology increases. These improvements in semiconductor performance and manufacturing drive the electrical, thermal and mechanical performance of semiconductor die packages. For example, as products with semiconductor chips become smaller and lighter, the space or area requirements of die packages have become increasingly important. In a conventional semiconductor die package having a cavity-up configuration, i.e. the active surface of the semiconductor faces away from the printed circuit board, conductive leads usually extend from one or more sides of the housing and are bent downward in an L-shape to attach to a printed circuit board (PCB) using surface-mount technology (SMT). In SMT mounting, each lead of a package is soldered onto a conductive portion of top surface of the PCB. A solder joint then maintains each lead of the die package in a fastened relationship with respect to the PCB.

In another die package configuration known as a pin grid array (PGA), the conductive leads extend from the bottom of the die package in rows and columns along the peripheral edge of the housing. PGA packages are usually utilized with a semiconductor devices requiring a large amount of conductive leads. Die packages with leads extending only from the side walls, as discussed above, usually have fewer conductive leads because of space limitations.

In a PGA, each lead is normally attached to a PCB using a mating connector or plated-through-hole (PTH) technology. A mating connector contains holes for receiving the leads of the PGA package. The PGA package is inserted into a mating connector having an array of holes that correspond to the array of conductive leads protruding from the underside of the PGA package. When using PTH technology, each lead of a package is inserted through a corresponding PTH and then soldered to form a solder joint fastening each lead in conductive contact with the PTH. In light of the additional space requirements of the conventional cavity-up semiconductor die package with leads extending from the side walls of die packages, there is a need for a cavity-up semiconductor die package having reduced size that is compatible with SMT mounting techniques. For example, BGA (Ball Grid Array) is a surface mount semiconductor package, which utilizes solder balls as its interface to the printed circuit board. The array allows for contacts to be further apart than many leaded packages.

Semiconductor die packages must also be capable of providing a stable and durable connection to the PCB. The conductive leads, which secure the die package to the PCB, must be sufficiently rigid and durable to withstand often harsh environmental conditions. Therefore, there is also a need for a high-density SMT compatible semiconductor die package with rigid, durable conductive leads that are easier and cheaper to manufacturer than conventional alternatives.

SUMMARY OF THE INVENTION

Accordingly, the present invention is directed to a micro grid array die package that substantially obviates one or more of the problems due to limitations and disadvantages of the related art.

The present invention has been made in view of the above circumstances and has as an object to provide a cavity-up semiconductor die package manufactured with durable conductive leads that is suitable for mounting using SMT methodology.

Another object of the invention is to provide a sturdy and reliable semiconductor die package having straight leads extending from the bottom of the die package.

A further object of the invention is to provided an economical method of manufacturing a semiconductor die package having straight leads extending from the bottom of the die package.

Yet another object of the invention is to provide an economical die package with decreased design complexity and manufacturing costs.

Another object of the invention is to provide a semiconductor die package providing a stable and durable surface mount connection.

A further object of the invention is to provide methods for making semiconductor die packages having characteristics such as those discussed above.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

Additional objects and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like elements.

Figure 1:
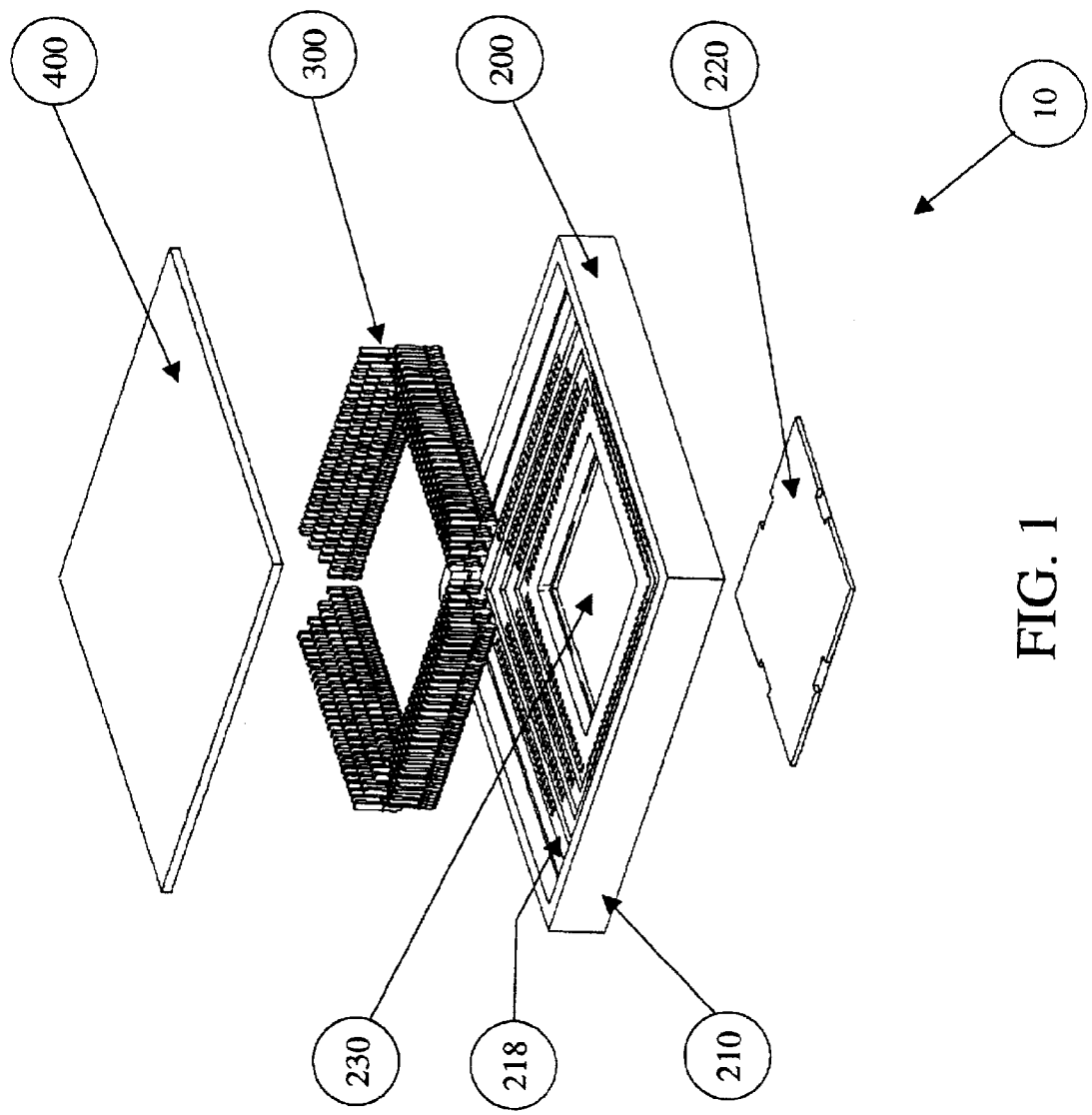
FIG. 1 provides an exploded view of an embodiment of a semiconductor die package according to the present invention.
Figure 2:
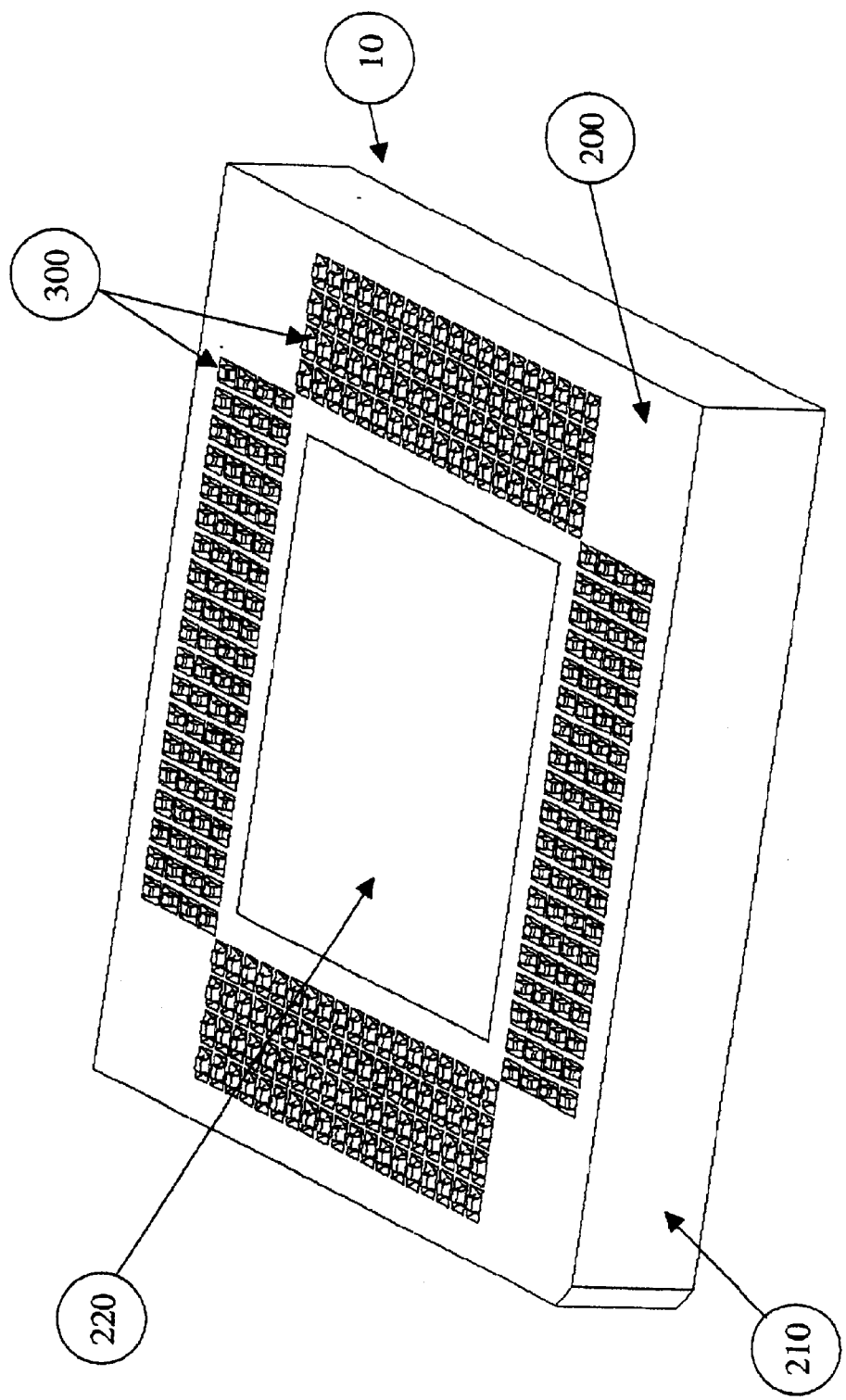
FIG. 2 shows the bottom view of one embodiment of a die package in accordance with the present invention.
Figure 3:
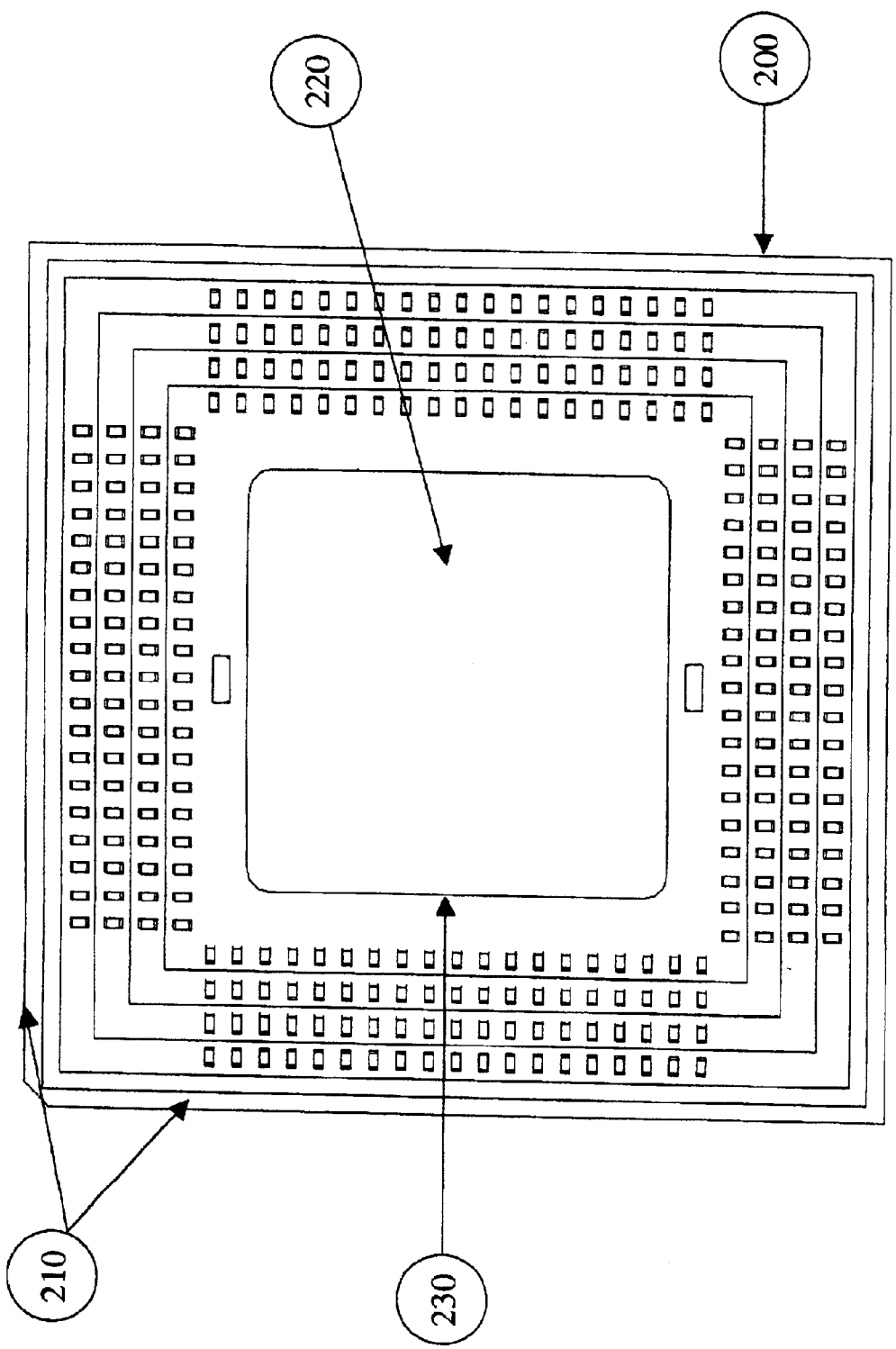
FIG. 3 shows a top view of an embodiment of a housing for the semiconductor die package shown in FIG. 1.

FIGS. 1 and 2 illustrate one embodiment of a semiconductor die package 10 for holding a semiconductor die according to the present invention. FIG. 1 provides an exploded view of the semiconductor die package, while FIG. 2 shows a bottom view of the same embodiment. As shown in FIG. 1, semiconductor die package 10 includes a housing 200 for holding one or more semiconductor dies (not shown), leads 300 that may be inserted into the housing 200, and a cover plate 400 disposed at the top of the housing 200. The housing 200 includes a plurality of side walls 210 having internal ledges 218 and includes an end plate 220.

As shown in FIG. 2, leads 300 extend from the bottom of the side walls 210 of housing 200. While FIG. 2 shows multiple rows of leads 300 extending from the bottom of side walls 210, the leads 300 may extend from one or more of the side walls 210 and may extend from the side wall(s) 210 in one or more rows.

As shown in FIG. 1, cavity 230 is defined within the interior of the housing 200. One or more semiconductor dies may be housed within the cavity 230, for example, by mounting to end plate 220 using an adhesive, such as an epoxy. Of course, semiconductor dies may be mounted within cavity 230 by means other than adhesive and may be mounted to structure other than the end plate 220. In the preferred embodiment, at least one semiconductor die is mounted on an upper surface of die attach plate 220. However, the present invention supports various die attachment methods or configurations. For example, one or more dies may be mounted on a substrate in a flip chip configuration and wire bonded to the leads 300.

Electrically conductive material (not shown in FIGS. 1 and 2), such as bonding wire, tape automated bonding, jumpers, and/or other electrically conductive material, may be used to electrically connect the leads 300 to the semiconductor die(s). Not all of the leads 300 need to be electrically connected to the semiconductor die. Some of leads 300 may not be connected to any electrically conductive element within the housing 200. Alternatively or in addition, some of leads 300 may be electrically connected to electromagnetic interference (EMI) or electrostatic discharge (ESD) shielding either internal or external to the housing 200, a ground or power plane included within the housing 200, or another electrical component within the housing.

An encapsulant (not shown) may cover all or part of the electrically conductive material and all or a portion of the semiconductor die(s). With reference to FIG. 1, cover plate 400 is mounted into a recess of housing 200. It is possible, but not necessary, for cavity 230 of housing 200 to be enclosed by cover plate 400. For example, the open-cavity arrangement according to the present invention may be achieved when the cover plate is flush with the surface of the semiconductor die(s), when the gap between the die(s) and the cover plate 400 is closed with encapsulant or another sealant or fitting, or when the gap between the dies(s) and the cover plate 400 is open. As one skilled in the art will appreciate, the die can be encapsulated with or without a cover plate 400.

Housing 200 will be described in greater detail in connection with FIGS. 3–7. As shown in the top view of the present embodiment in FIG. 3, housing 200 includes side walls 210, end plate 220, which is joined to the side walls 210, and cavity 230 for receiving one or more semiconductor dies. While in one preferred embodiment the cavity 230 receives one semiconductor die, multiple semiconductor dies may be accommodated by appropriately sizing and/or shaping the cavity 230. Cavity 230 may be defined within the interior of housing 200, for example, by the interior surfaces of the side walls 210 and end plate 220, including recesses in the end plate 220, in one or more of the side walls 210, or in both the end plate 220 and one or more of the side walls 210. Of course, cavity 230 may be defined in whole or in part by other structure located within side walls 210 and end plate 220.

Figure 4:
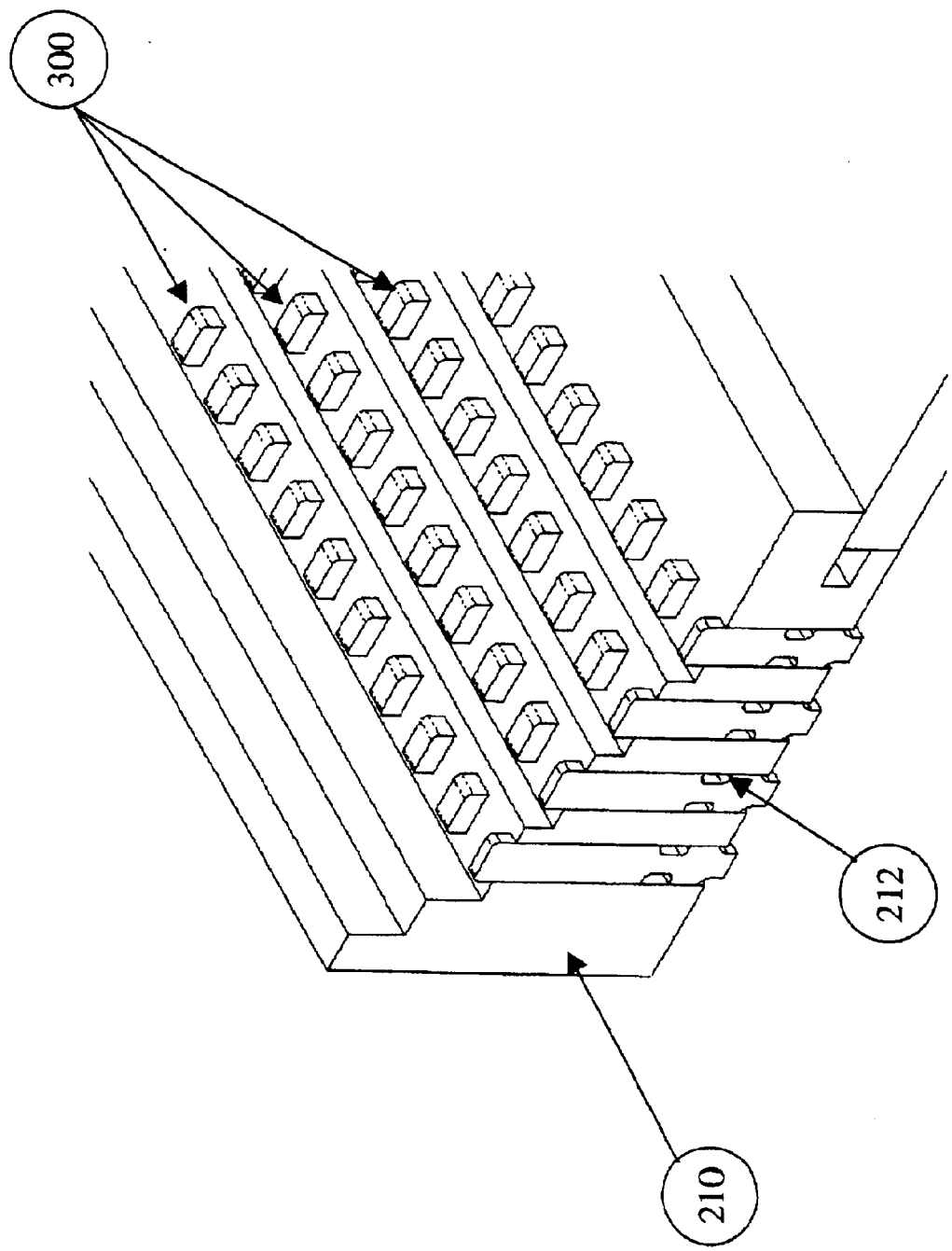
FIG. 4 shows a partial side section view of the housing depicted in FIG. 3.
Figure 5:
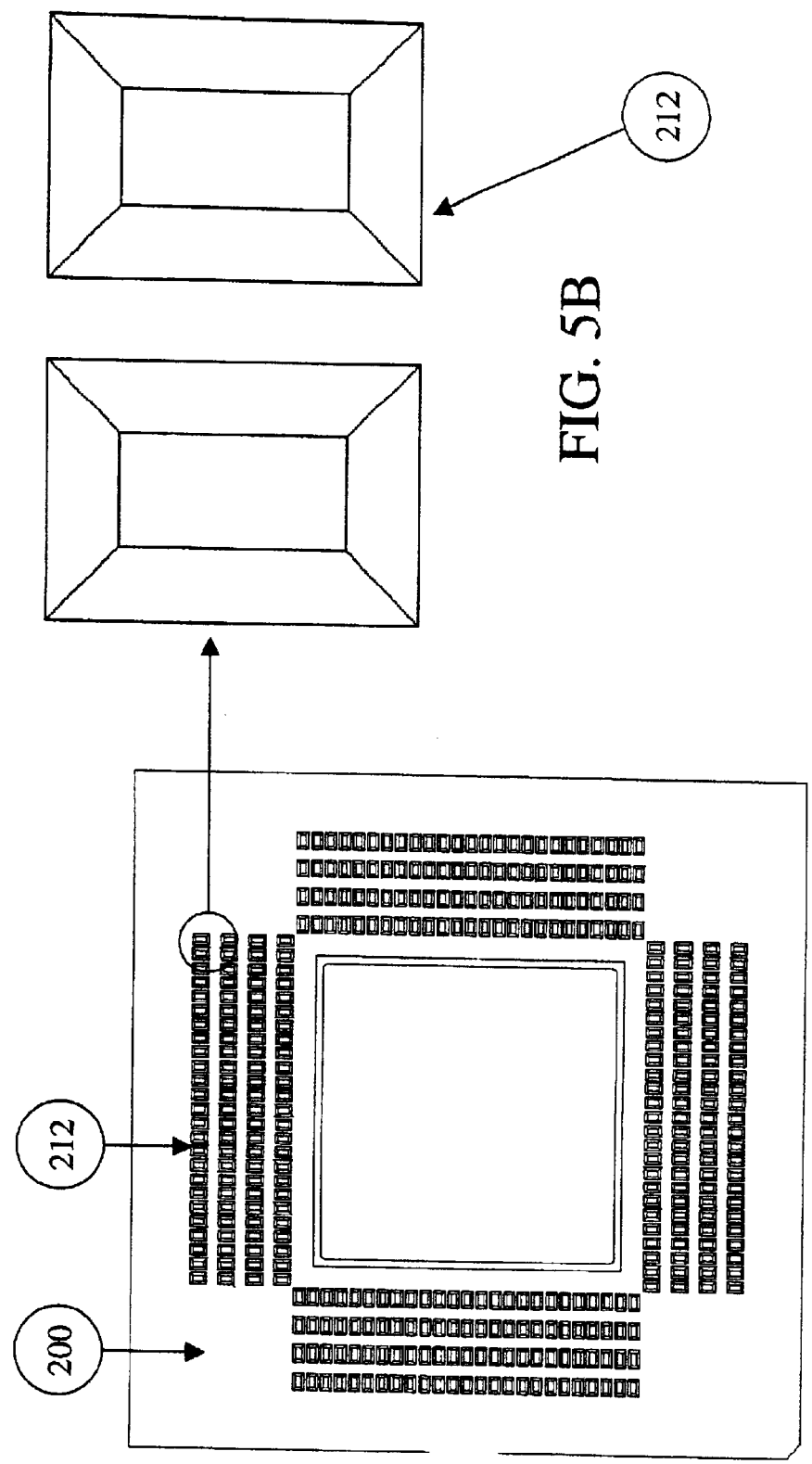
FIG. 5A shows the bottom surface of the housing with openings in accordance with an exemplary embodiment of the present invention.
FIG. 5B shows a close-up view of typical openings in the bottom surface of the housing shown in FIG. 5B.

With reference to FIG. 4, one or more tiered side walls 210 preferably include openings 212 through the upper surface of the tier for receiving leads 300. In the preferred embodiment, the openings 212 in the bottom surface of the side walls 210 are shaped to accommodate insertion of leads 300. FIG. 5A shows the bottom surface of the housing 200 with openings 212 in accordance with an exemplary embodiment of the present invention. FIG. 5B shows a close-up view of the openings 212 depicted in FIG. 5A. As shown in FIGS. 5A and 5B, openings 212 may be rectangular to receive and retain leads 300. Alternatively, openings 212 may have any shape to facilitate retention and accurate positioning of the leads 300.

Figure 6:
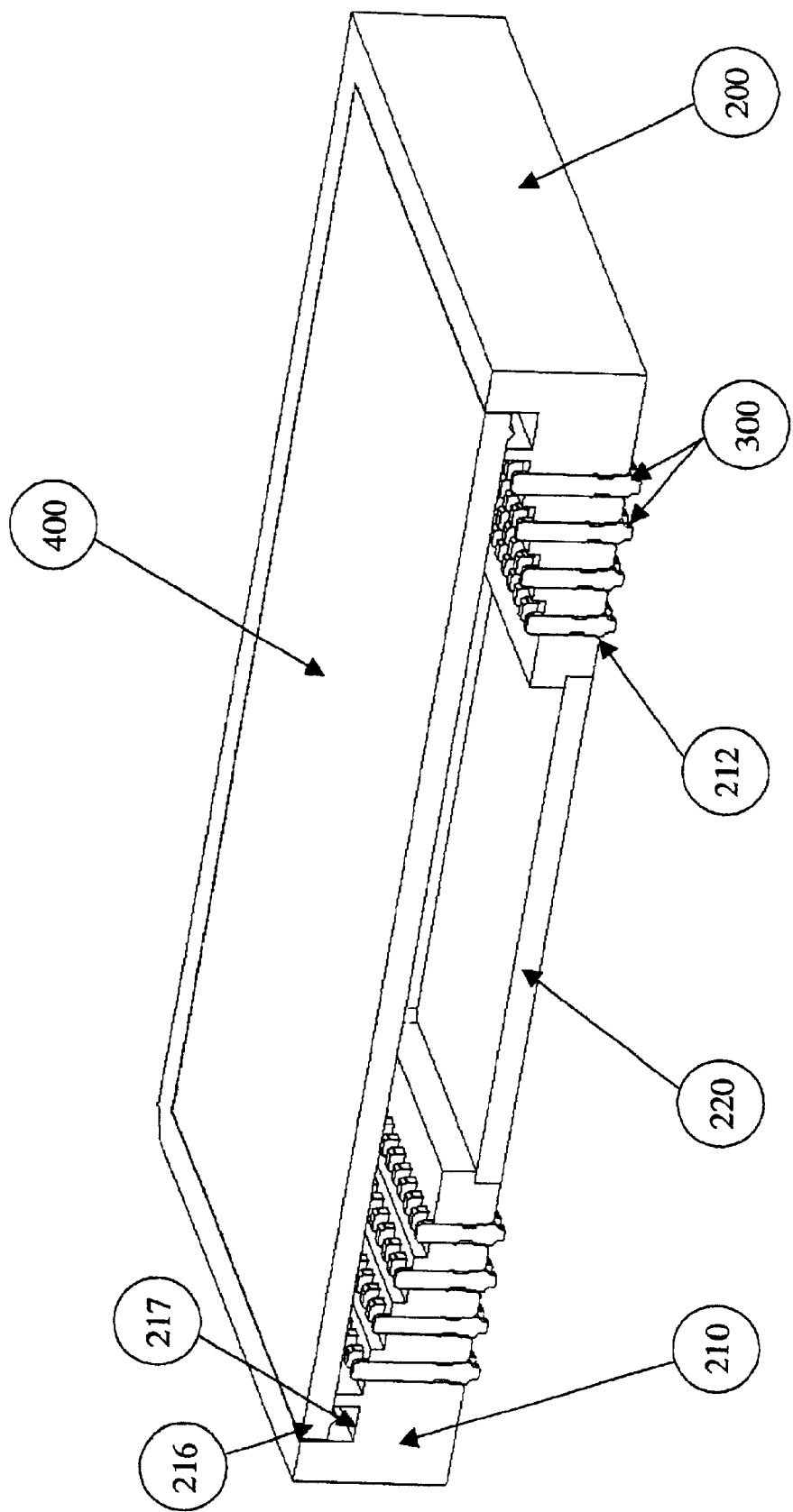
FIG. 6 shows a cross section of the housing depicted in FIG. 3.
Figure 7:
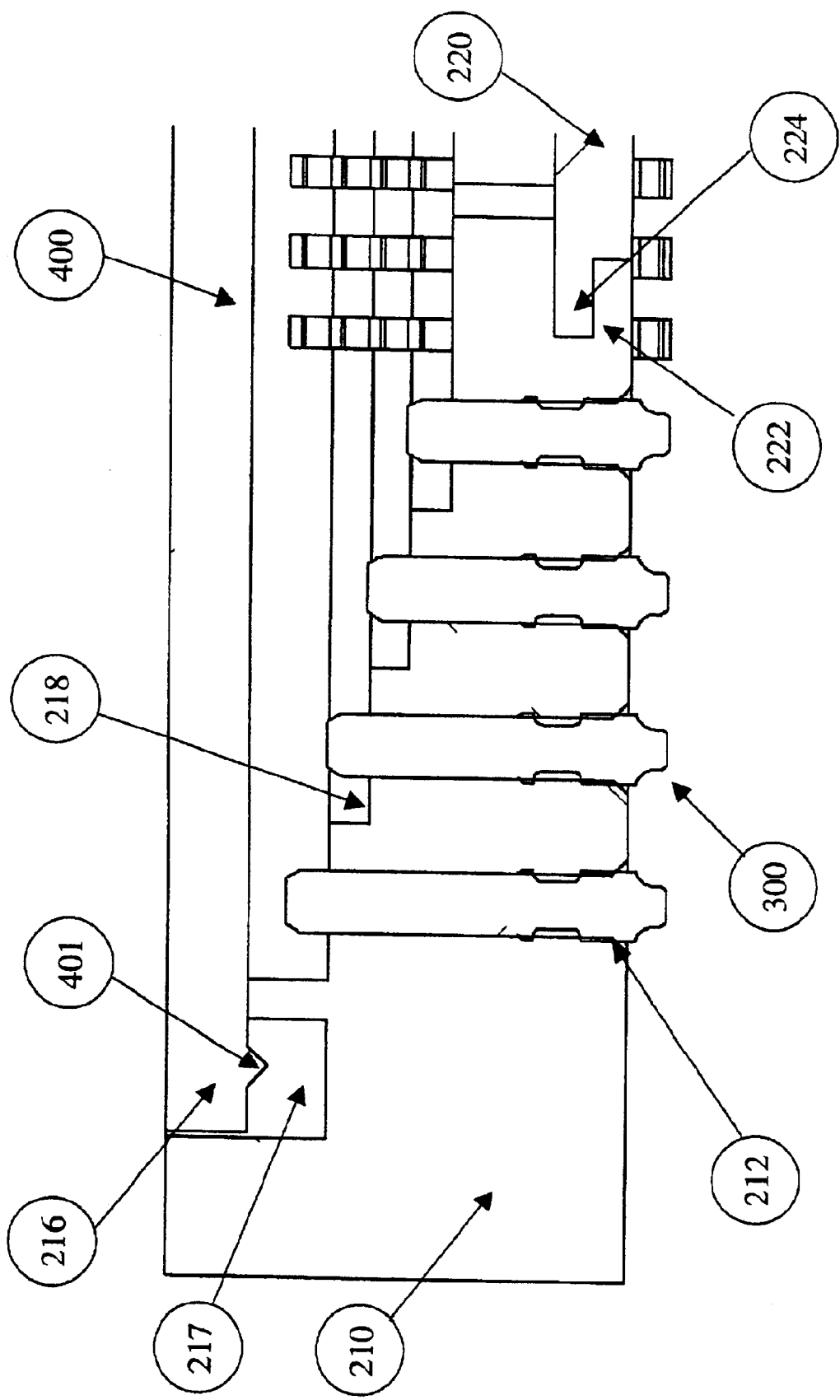
FIG. 7 shows a close-up view of the cross section of the housing shown in FIG. 6.

In the embodiment depicted in FIGS. 6 and 7, the end plate 220 provides a stable and sturdy base for supporting the semiconductor die. When the package is mounted to a printed circuit board or other substrate, an adhesive, such as an epoxy, may be applied to secure the housing 200 to the substrate. Consequently, external forces applied to the package will be transferred to the substrate through the end plate 220 to reduce shear forces on the leads 300. The end plate 220 may be made of a conductive material, for example copper, to dissipate heat away from the semiconductor die. Alternatively, end plate 220 may be soldered to the substrate for electrical or thermal conduction.

With reference to FIG. 6, side walls 210 may be molded from an insulative, polymeric material, such as a liquid crystal polymer. One suitable liquid crystal polymer is VECTRA™ E 130i, which is available from Ticona™. Of course, housing 200 may be made of any suitable organic or inorganic material or combination of materials and might also have a conductive surface for shielding from electromagnetic interference.

The openings 212 may be molded into the side walls 210 or may be formed after molding by removing material from the side walls 210. Further, the side walls 210 may be formed together as a single unit or, alternatively, molded separately and then joined together using an adhesive or other suitable means. The end plate 220 may be molded together with the side walls 210 to form a single one-piece unit, or the end plate 220 may be formed separately and then attached. FIGS. 6 and 7 show an embodiment of housing 200 having a single material, one-piece molded construction of side walls 210 integrally molded with end plate 220.

Figure 8:
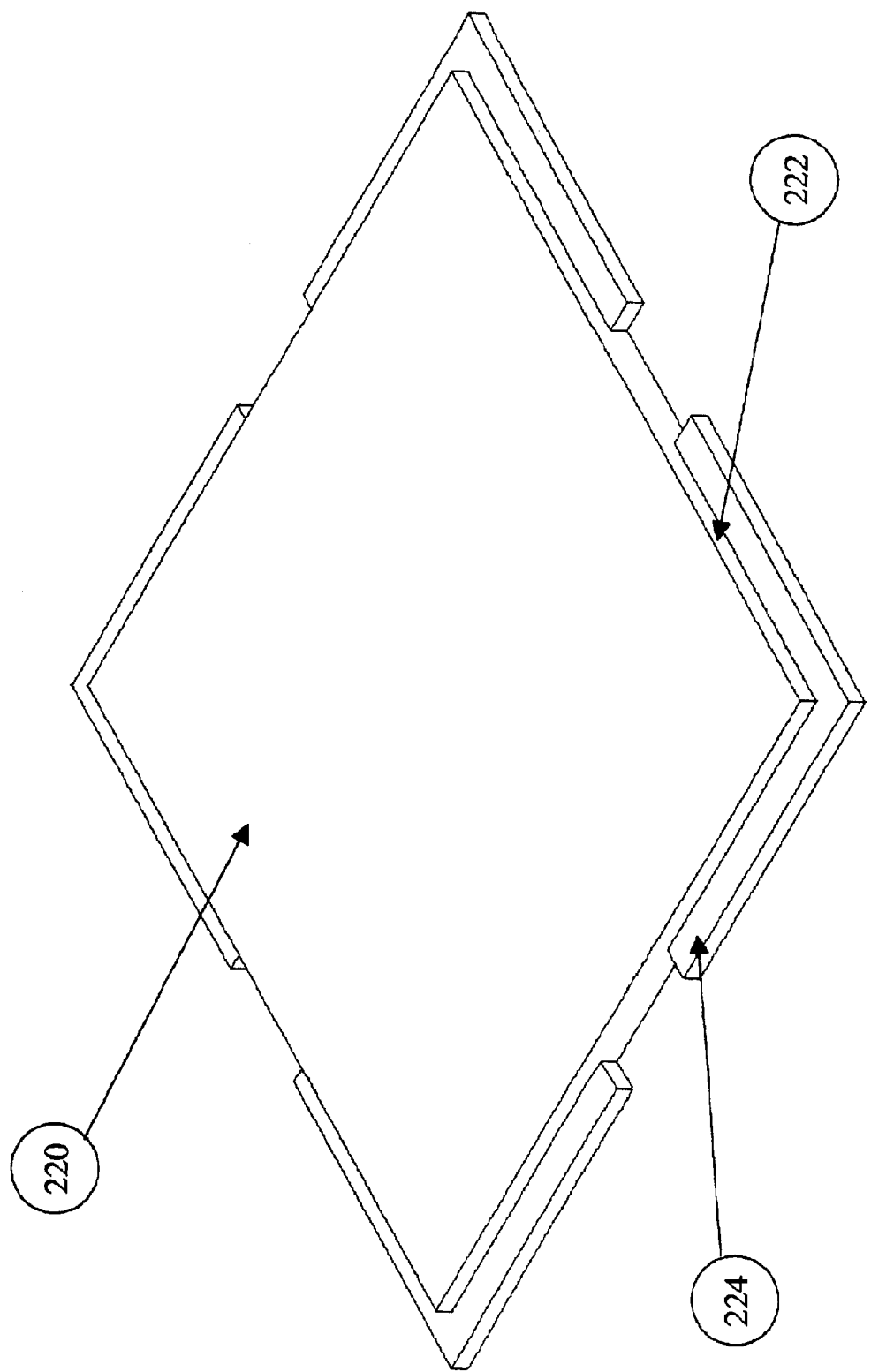
FIG. 8 shows one embodiment of an end plate according to the present invention.

As shown in FIG. 8, the periphery of the end plate 220 may include a step 222 and a narrowed peripheral portion 224. When molded into side walls 210, as shown in FIGS. 6 and 7, the narrowed peripheral 224 increases the length of the interface between the side walls 210 and the end plate 220, thereby more effectively preventing moisture and other contaminants from entering the housing 200, as well as providing a locating interface surface for the end plate 220 to side wall 210 portions.

The semiconductor die or dies may be mounted directly to the end plate 220 using an adhesive. A platform (not shown) for mounting the semiconductor die may be formed as part of the end plate 220 or formed separately and attached as part of the end plate. The platform may be used to adjust the level of the top surface of the semiconductor die(s) relative to the leads 300, the side walls 210, and/or the cover plate 400.

As shown in FIGS. 6 and 7, side walls 210 may include a recess 216 for receiving the cover plate 400, thereby making the top surface of the cover plate 400 flush with the top surface of side walls 210. Moreover, side walls 210 may include one or more grooves 217 for receiving one or more lips 401 located on the bottom surface of cover plate 400. An adhesive may be applied to the recess 216, the groove 217, and/or the edges of the cover plate 400 to secure the cover plate 400 to the housing 200. Other mechanisms for mounting the cover plate 400 to the housing 200 may be used as well, for example, the cover plate 400 may be adhered to the housing 200 without the use of a recess 216 or groove 217, the cover plate 400 may clip or snap to the housing 200, be press fit, or heat sealed, or be permanently or removably attached by other means.

The inside surface of side walls 210 preferably have a series of ledges 218 that facilitate bonding arrangements of the leads 300 to the die(s). FIG. 7 provides a detailed view of the side wall 210 having ledges 218 or steps with openings 212 for locating and possibly supporting multiple tiers of leads 300. In one embodiment, the side wall 210 has four tiers 218 with openings 212 formed through the upper surface for receiving leads 300. In a preferred embodiment, leads 300 are inserted into preformed openings 212 in the housing 200. As an alternative, housing 200 may be molded around leads 300, for example, by injection molding techniques. As shown in FIGS. 4 and 7, leads 300 protrude from the upper surface of side walls 210, thereby forming a series of preferably four vertically spaced rows of multiple leads 300 around the periphery of the cavity. The leads 300 extend through the side wall 210 and exit at the bottom surface of the same side wall 210 as depicted in FIGS. 2 and 7.

As one skilled in the art will appreciate, the die package of the present invention is not limited to a housing 200 with 4 rows of vertically spaced leads 300. While not shown in the accompanying drawings, die packages having one or more side walls 210 with one or more ledges 218 of vertically spaced leads 300 is also in accordance with the teachings of the present invention.

Figure 9:
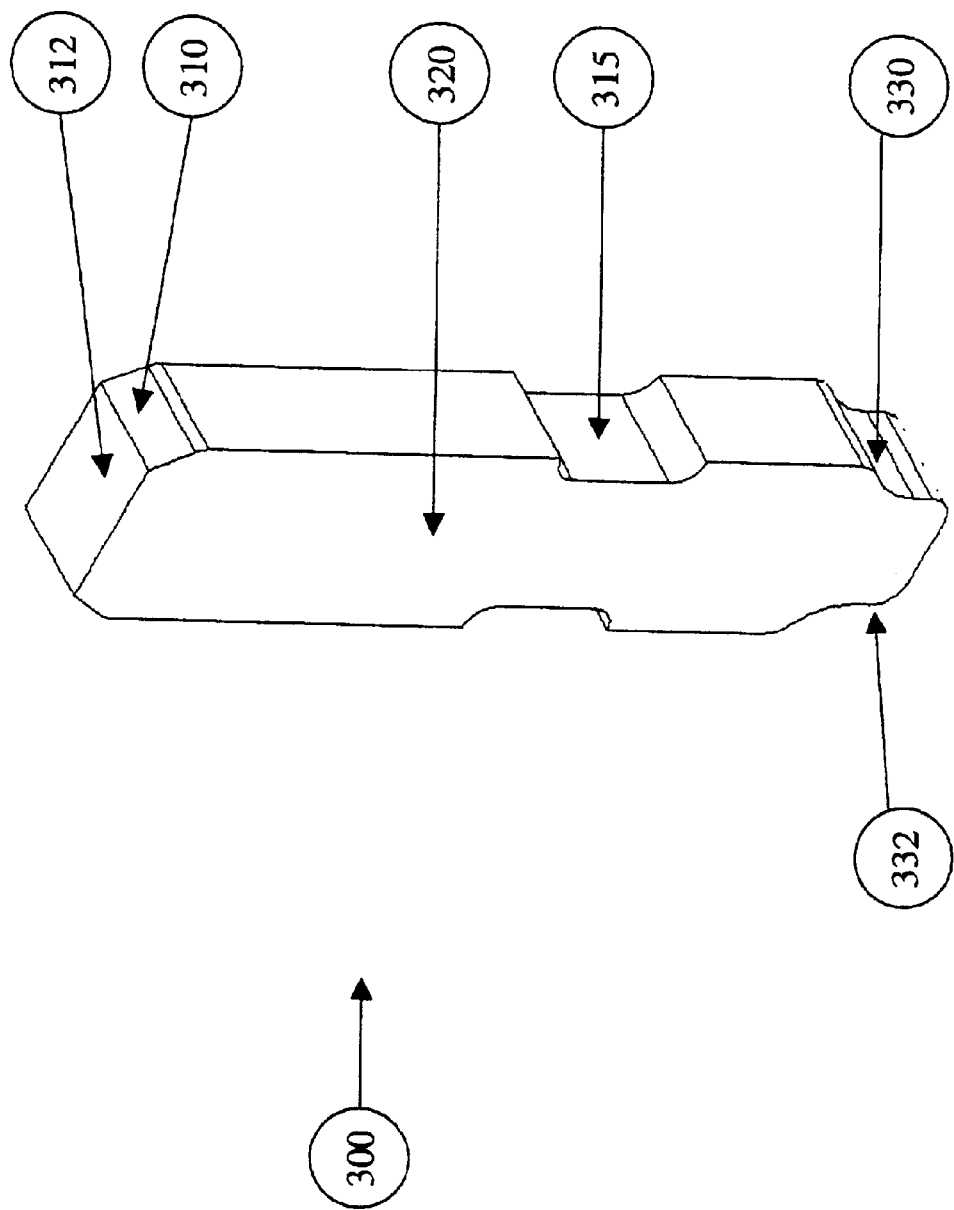
FIGS. 9 and 10 illustrate views of an embodiment of a lead for use in the semiconductor die package shown in FIG. 1.
Figure 10:
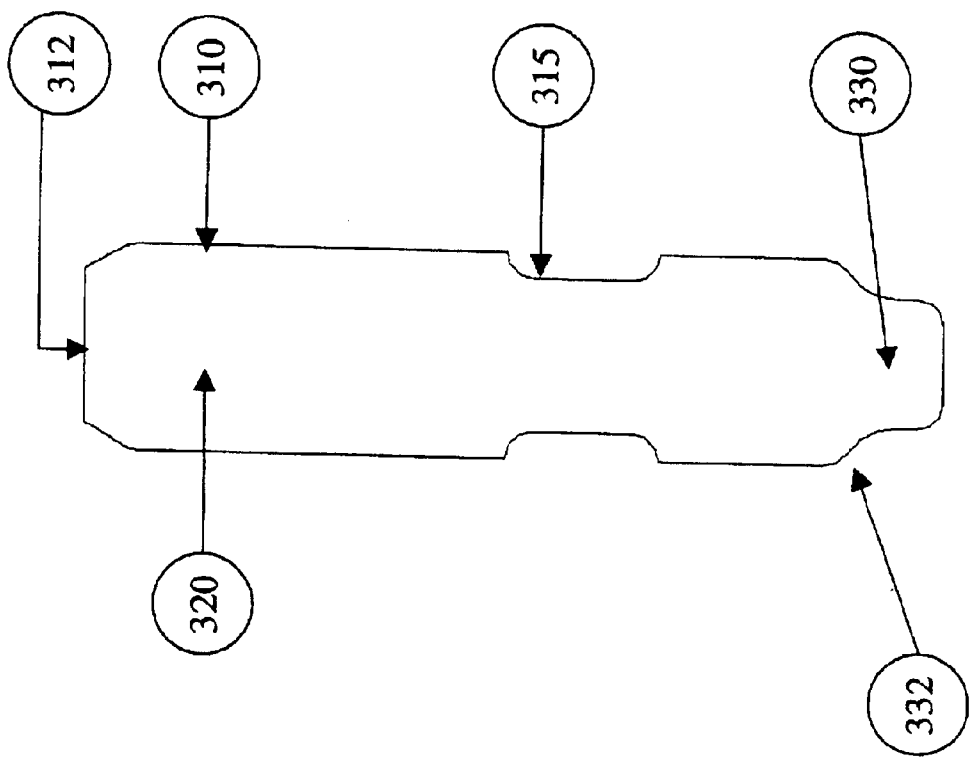

FIGS. 9 and 10 illustrate one embodiment of the conductive leads 300. As shown in FIGS. 9 and 10, the conductive leads 300 are generally straight, thereby providing a rigid and durable connection to a PCB. The conductive leads 300 each include an internal lead section 310, a stabilizing section 320, and an external lead section 330. The internal lead section 310 having a flat bonding surface 312 resides inside the housing 200 to facilitate direct or indirect connection to the semiconductor die(s) or other electrical components within the housing 200.

Figure 20:
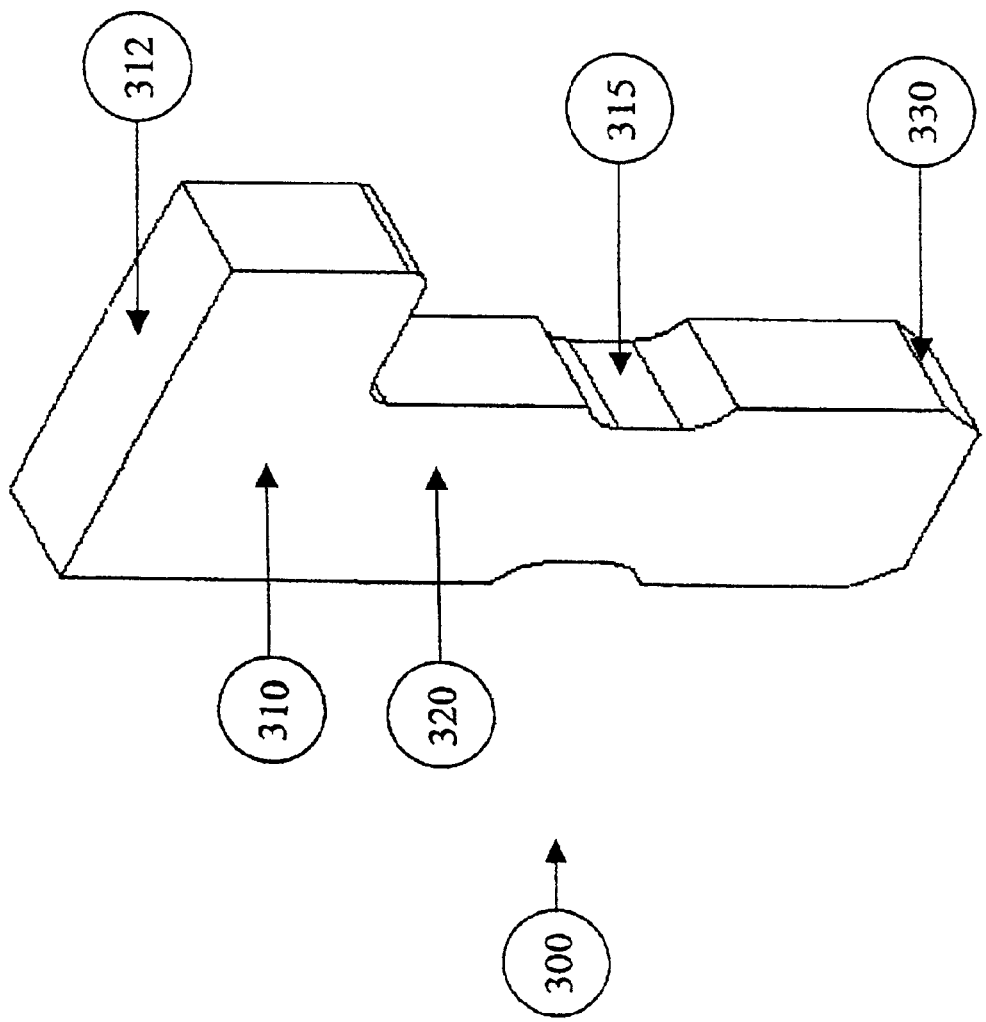
FIG. 20 illustrates another embodiment of a lead for use in the semiconductor die package shown in FIG. 1.

In an alternative embodiment shown in FIG. 20, the internal lead section 310 may be wider than the stabilizing section 320 to provide a larger flat bonding surface 312 for contacting electrically conductive material used to connect the leads to the semiconductor die(s). Moreover, an internal lead section 310 that is relatively wider than stabilizing section 320 may also aid in properly positioning the lead 300 in the housing 200 during insertion. The bonding surface 312 may be plated with gold or another highly conductive material to ensure a reliable electrical connection. If a particular lead 300 is not intended to be used for establishing an electrical connection, the bonding surface 312 need not be formed.

In the preferred embodiment, leads 300 are inserted into the bottom surface of side wall 210 having shaped openings 212, as shown in FIGS. 5A, 5B and 7. On the other hand, leads 300 with an enlarged internal lead section 310 can be inserted into the upper surface of side walls 210 so that the internal lead section 310 rests against the housing 200. Alternatively, leads 300 may include internal lead sections 310 with various shapes for improving the connection to the semiconductor die(s) or other electrical components in the housing.

The stabilizing section 320 may have any type of cross-section, including, but not limited to a rectangular, square, or round cross section that preferably corresponds to the shape of the opening 212. In a preferred embodiment, the stabilizing section 320 has a rectangular cross section. As shown in FIGS. 9, 10, and 20, opposite sides of the stabilizing section 320 may include a notched section 315 that results in a "neck-like" appearance.

In one preferred embodiment, stabilizing section 320 frictionally engages the inner walls of housing 200 within opening 212. The strength of the frictional engagement may be sufficient to retain lead 300 in housing 200. Alternatively, the leads 300 may be bonded to the housing 200 using a suitable adhesive. Further, the housing 200, or just the side walls 210, may be molded around the leads 300.

Figure 11:
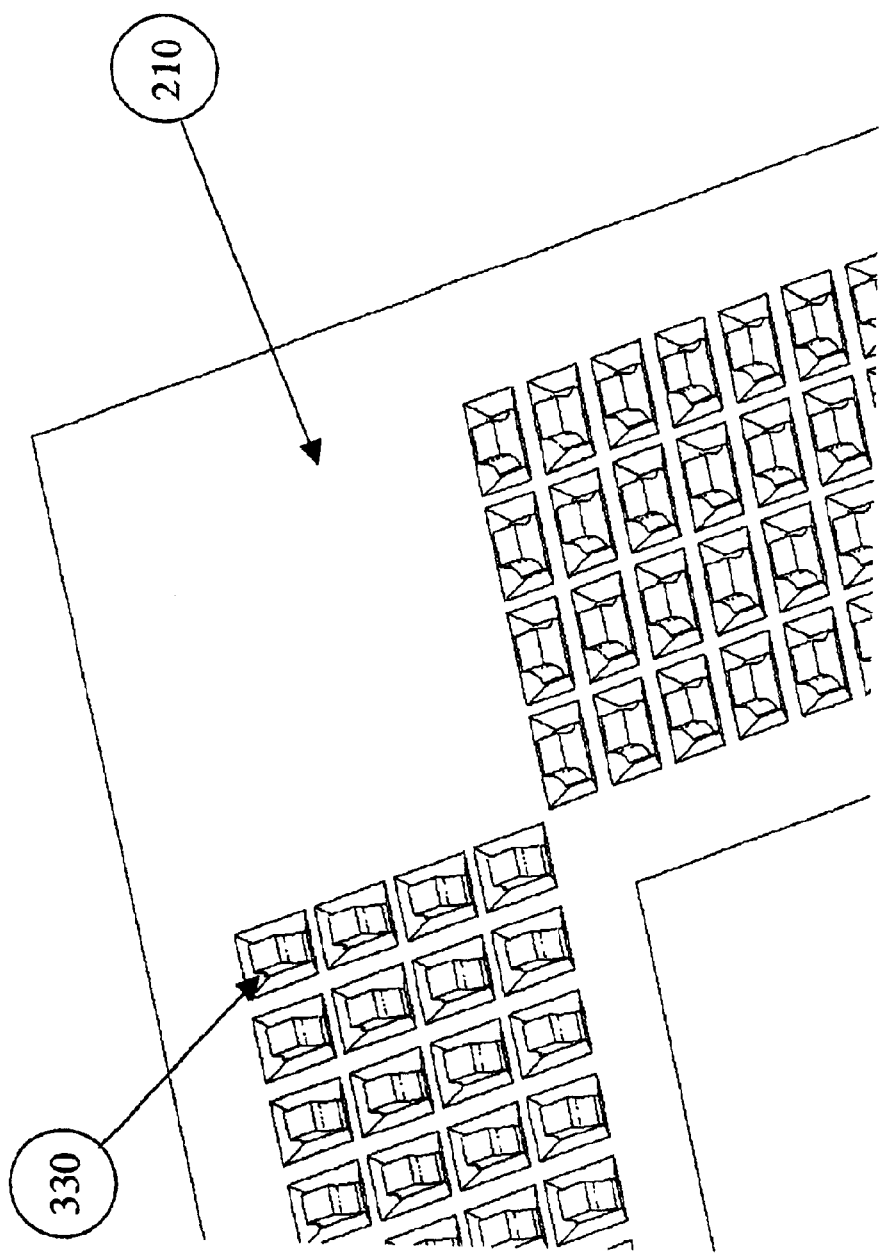
FIG. 11 shows a close-up view of a corner of the die package shown in FIG. 2.
Figure 12:
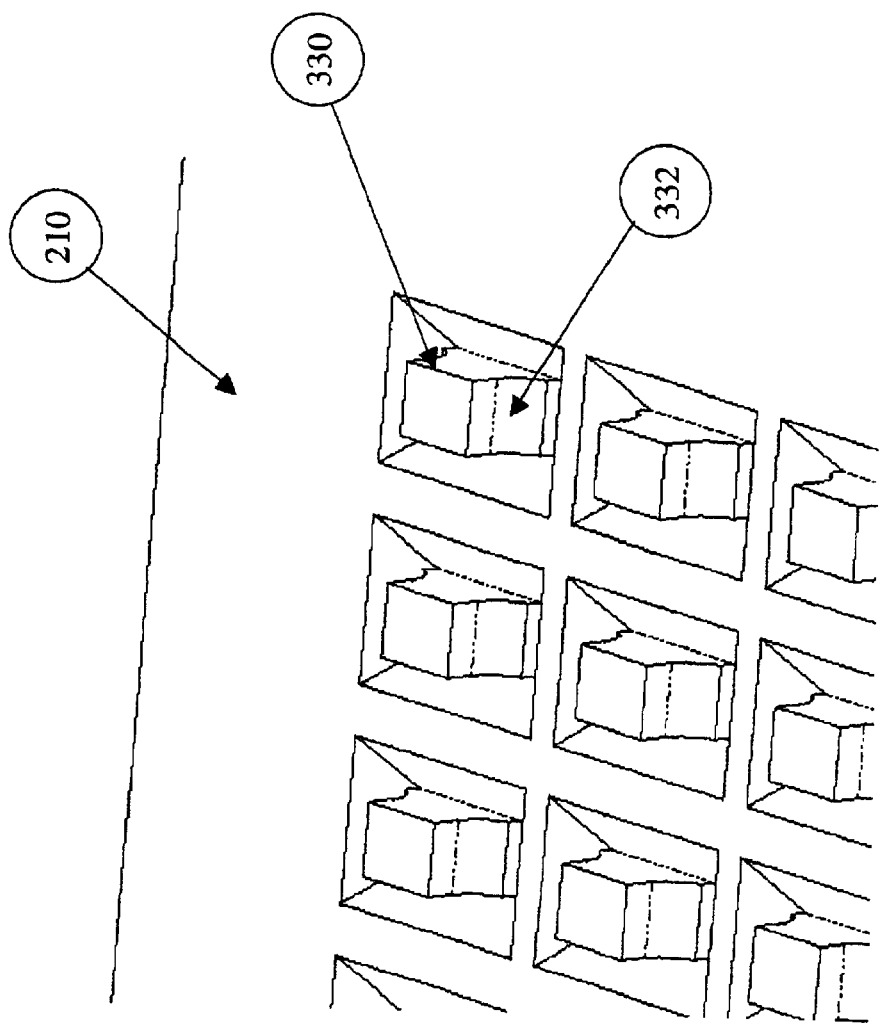
FIG. 12 shows a close-up view of the die package shown in FIG. 11.

As shown in FIGS. 11 and 12, the external lead section 330 extends from the bottom of side wall 210 in multiple rows around the perimeter of the housing 200. The long rectangular axis of the leads 300 may be perpendicular to the external side wall 210. In one embodiment, the distance between adjacent leads 300 in a row parallel to the external side wall is at least 0.3 mm.

In order to ease routing and to improve mounting using SMT, the opposite sides of external lead section 330 are designed with sloped notches 332. The notched section 332, which decreases the width of the external lead section 330, increases the clearance between adjacent leads 300 extending from the bottom surface of side walls 210. Therefore, the distance between adjacent rows of leads 300 parallel to an external side wall is approximately 0.2 to 0.5 mm. The increased clearance improves space efficiency and facilitates routing on the PCB. In one embodiment of the present invention, a die package measuring 27.18 mm by 27.18 mm may have 608 or fewer leads 300 extending from the underside of the housing 200. Whereas, a die package measuring 17.53 mm by 17.53 mm may contain 304 or fewer leads 300. The following table describes four exemplary embodiments of the present invention in more detail.

| Leads | Package Size (mm) | Cavity Size (mm) | Minimum Die Size (mm) |
|---|---|---|---|
| 608 | 27.18 × 27.18 | 17.53 × 17.53 | 15.45 × 15.45 |
| 512 | 24.13 × 24.13 | 14.48 × 14.48 | 12.40 × 12.40 |
| 400 | 20.57 × 20.57 | 10.92 × 10.92 | 8.83 × 8.83 |
| 304 | 17.53 × 17.53 | 7.87 × 7.87 | 5.78 × 5.78 |

Figure 19:
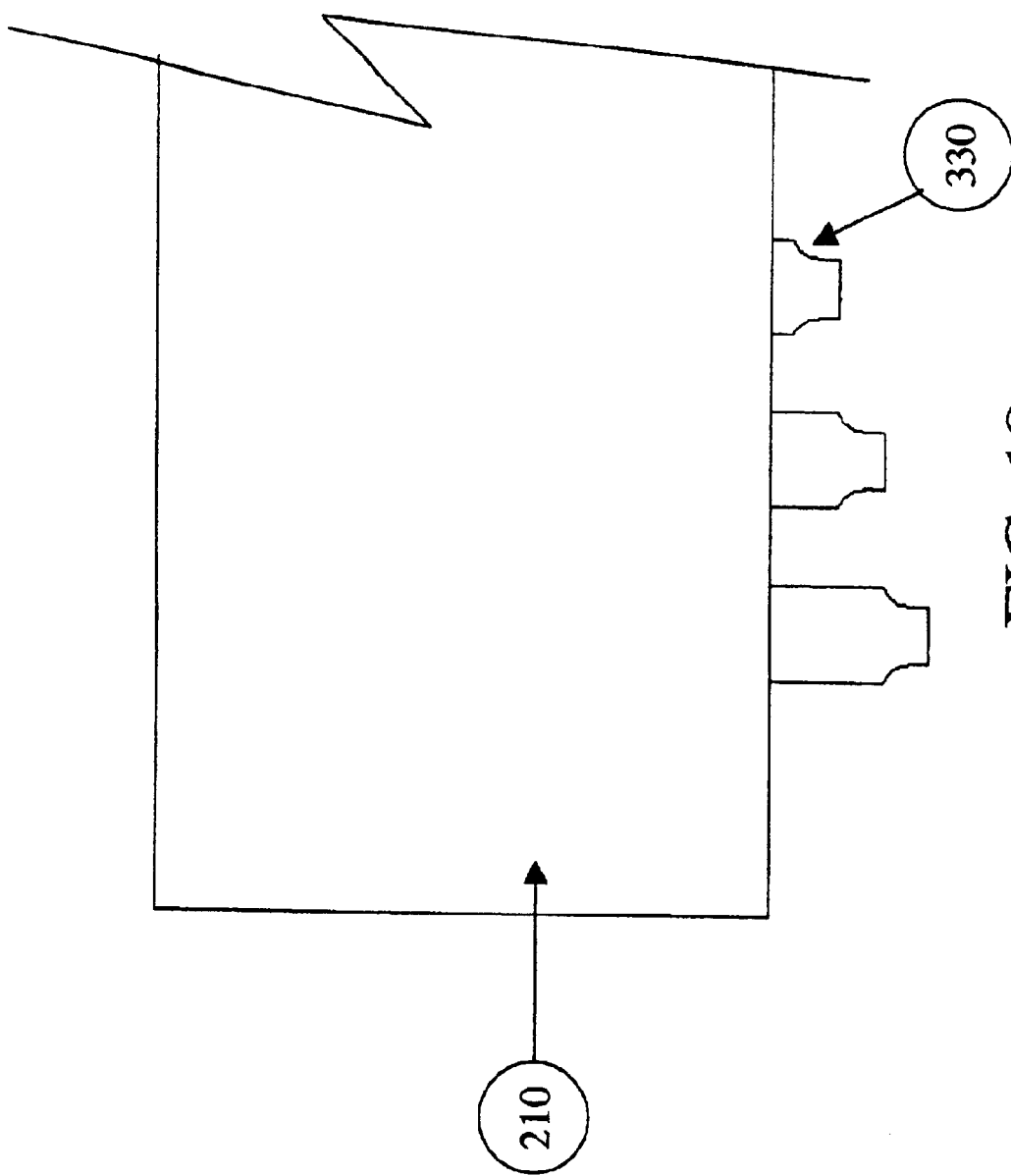
FIG. 19 shows a partial side view of one embodiment of a semiconductor die package according to the present invention.

An external lead section 330 with slope-shaped notches 332 also facilitates surface mounting to a PCB or other substrate. Rather than having slope-shaped notches 332, the external lead section 330 may have a butt end or other configuration. Alternatively, the external lead section 330 may be adapted to connect to a printed circuit board or other substrate by other means, such as, for example, plated through hole (PTH) technology. Furthermore, as shown in FIG. 19 the external lead sections 330 may have different lengths for SMT mounting to different layers of a multi-layer substrate. The external sections 330 may extend varying distances from the bottom of the side walls 210, as dictated by the particular application of the embodiment.

Figure 13:
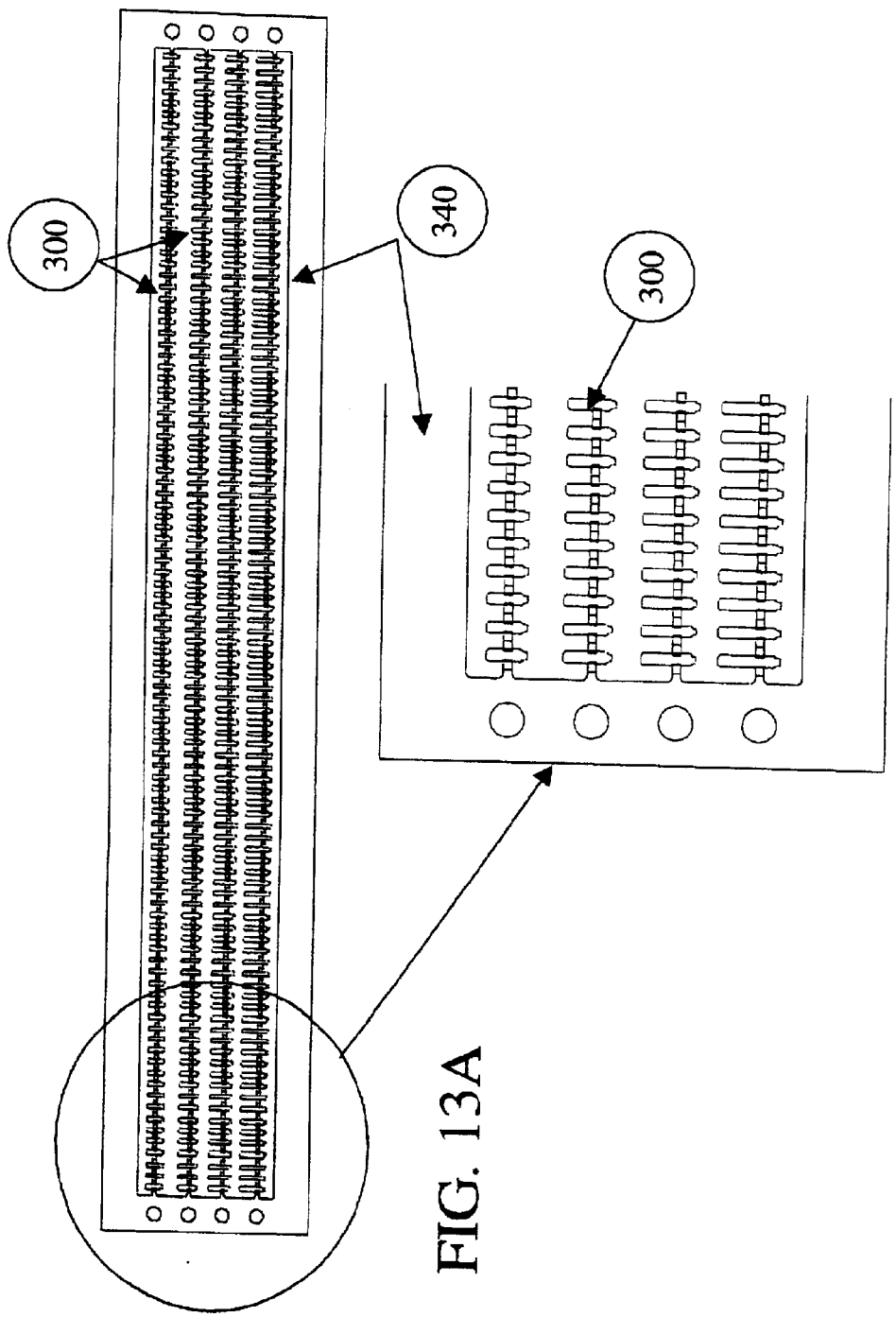
FIG. 13A shows an exemplary metal strip from which conductive leads may be stamped.
FIG. 13B shows a portion of the exemplary metal strip depicted in FIG. 13A.

Each of the leads 300 is manufactured and inserted into the multiple-level side walls 210 before the die attach step. Alternatively, if fewer leads 300 are needed for a particular embodiment, the leads 300 may be selectively inserted into side walls 210, thereby reducing costs associated with the unused leads. The simple rectangular shape of the leads 300 are easier to manufacture compared to conventional cavity-up leads. The generally straight leads 300 are preferably stamped from a metal blank and then finished by machining. FIG. 13A shows an exemplary metal strip 340 containing rows of leads 300. The leads 300 are extremely rigid because they are not bent in an L-shaped configuration. Accordingly, leads 300 resist bending when mounted to a substrate, such as a printed circuit board, and provide a sturdy, stable connection.

Figure 21:
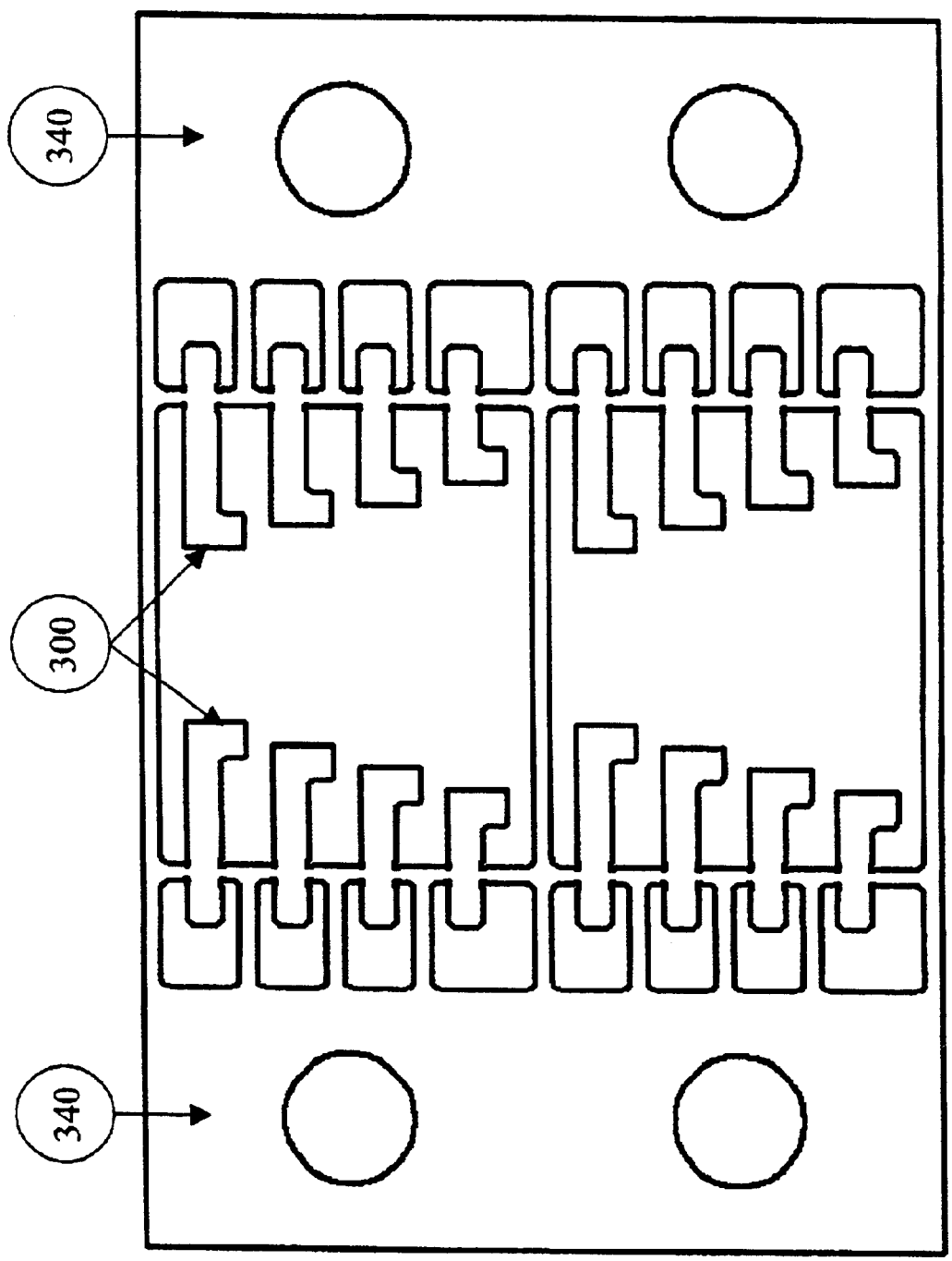
FIG. 21 shows an exemplary metal strip from which conductive leads, as shown in FIG. 20, may be stamped.

As shown by the close-up of the exemplary metal strip 340 in FIG. 13B, a large number of the generally straight leads 300, as depicted in FIG. 9, may be efficiently stamped from a metal strip 340, thereby reducing scrap waste. Alternatively, leads 300 shown in FIG. 20 may be stamped from an exemplary metal strip 340 shown in FIG. 21. As mentioned above in reference to FIGS. 9 and 20 leads 300 may have stabilizing sections 320 having notched sections 315. In one embodiment of the present invention, the notched section 315 results from the manufacture of the lead 300. The notched sections 315 are created when the lead 300 is stamped or punched from a strip of metal 340.

Figure 14:
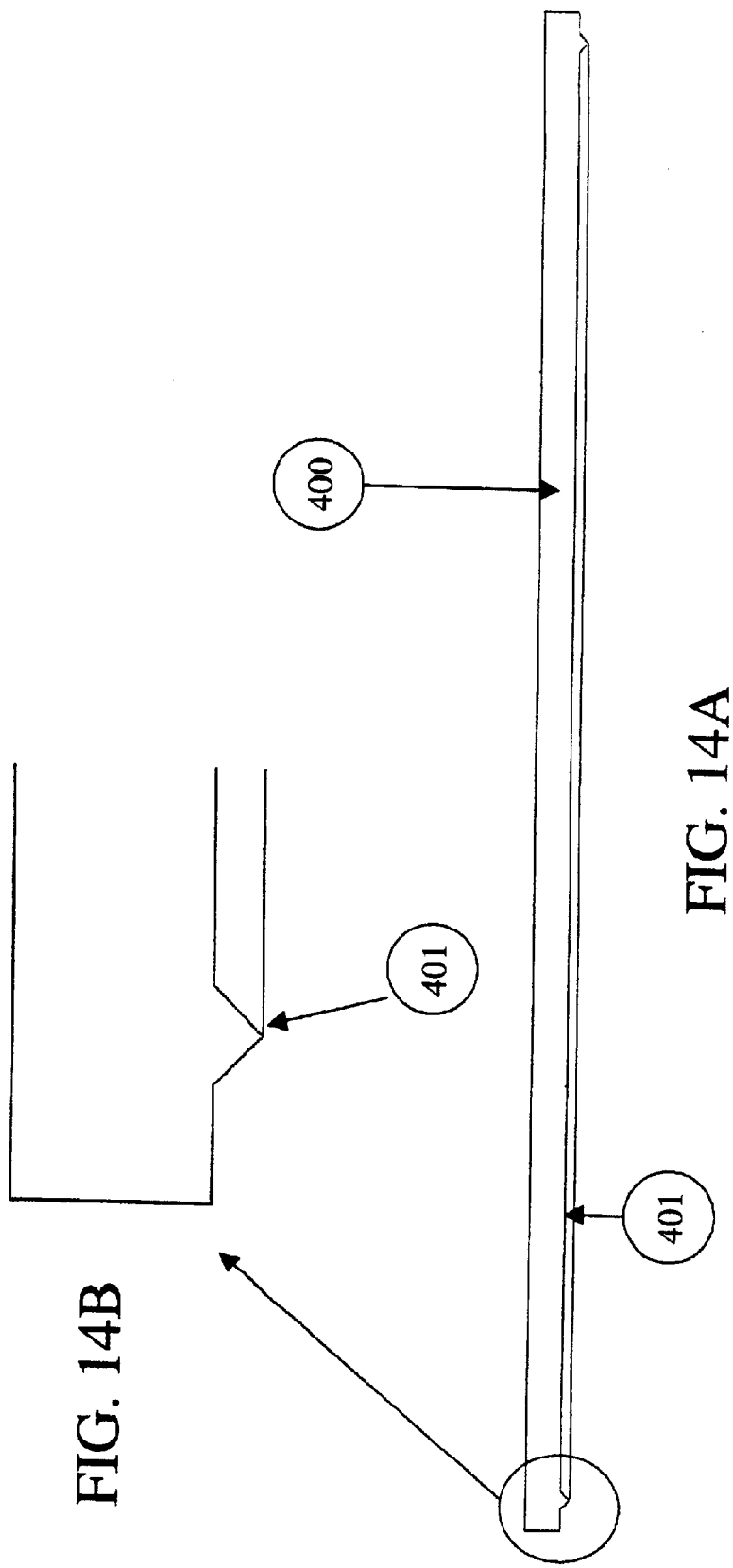
FIG. 14A illustrates the side of an embodiment of a cover plate for use with semiconductor die package shown in FIG. 1.
FIG. 14B shows a portion of the exemplary cover plate depicted in FIG. 14A.
Figure 15:
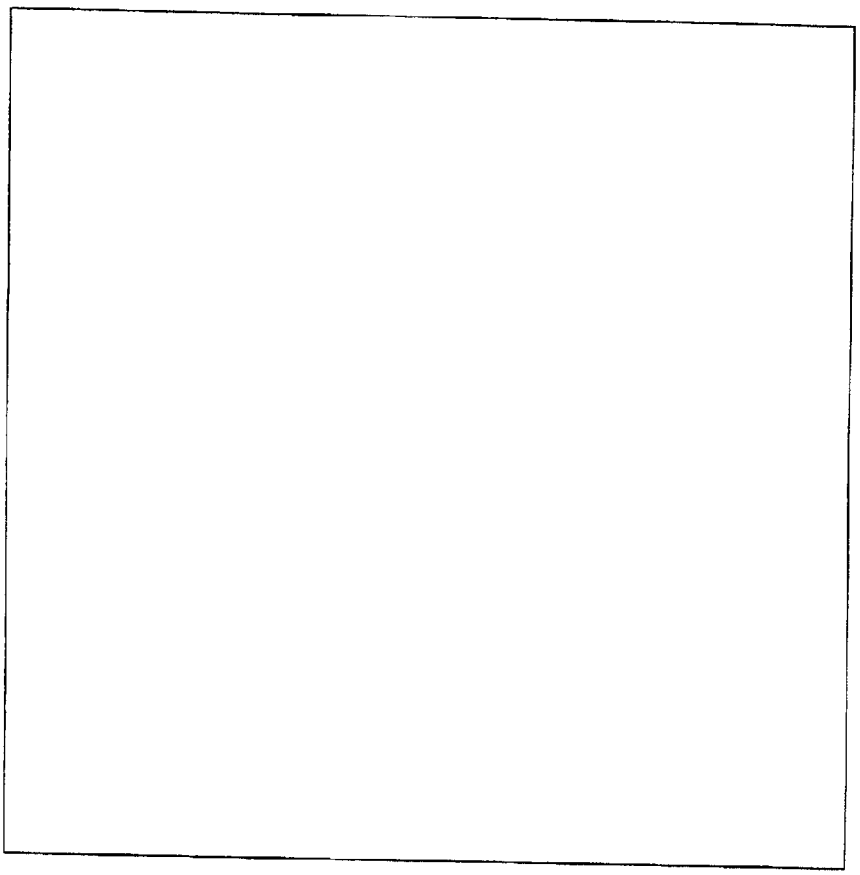
FIG. 15 shows the top of the cover plate shown in FIG. 14A.

FIGS. 14A, 14B and 15 illustrate the cover plate 400. As shown from the side in FIG. 14A, the generally flat cover plate 400 may include a lip 401, shown in more detail in FIG. 14B, to facilitate reception into a groove 217 of the housing 200. In the alternative, the cover plate 400 may be flat or may include apertures, heat spreader, heat sink, or protrusions, for example, to aid in mounting to the housing 200. Also, the cover plate 400 is thin to reduce space requirements of the die package and to promote good thermal characteristics. In some applications, the cover plate 400 may be made of a conductive material, for example copper, or insulative material, such as the liquid crystal polymer VECTRA™ E 130i. A conductive material may be used to form the cover plate 400 to discharge heat away from the semiconductor die(s).

Figure 16:
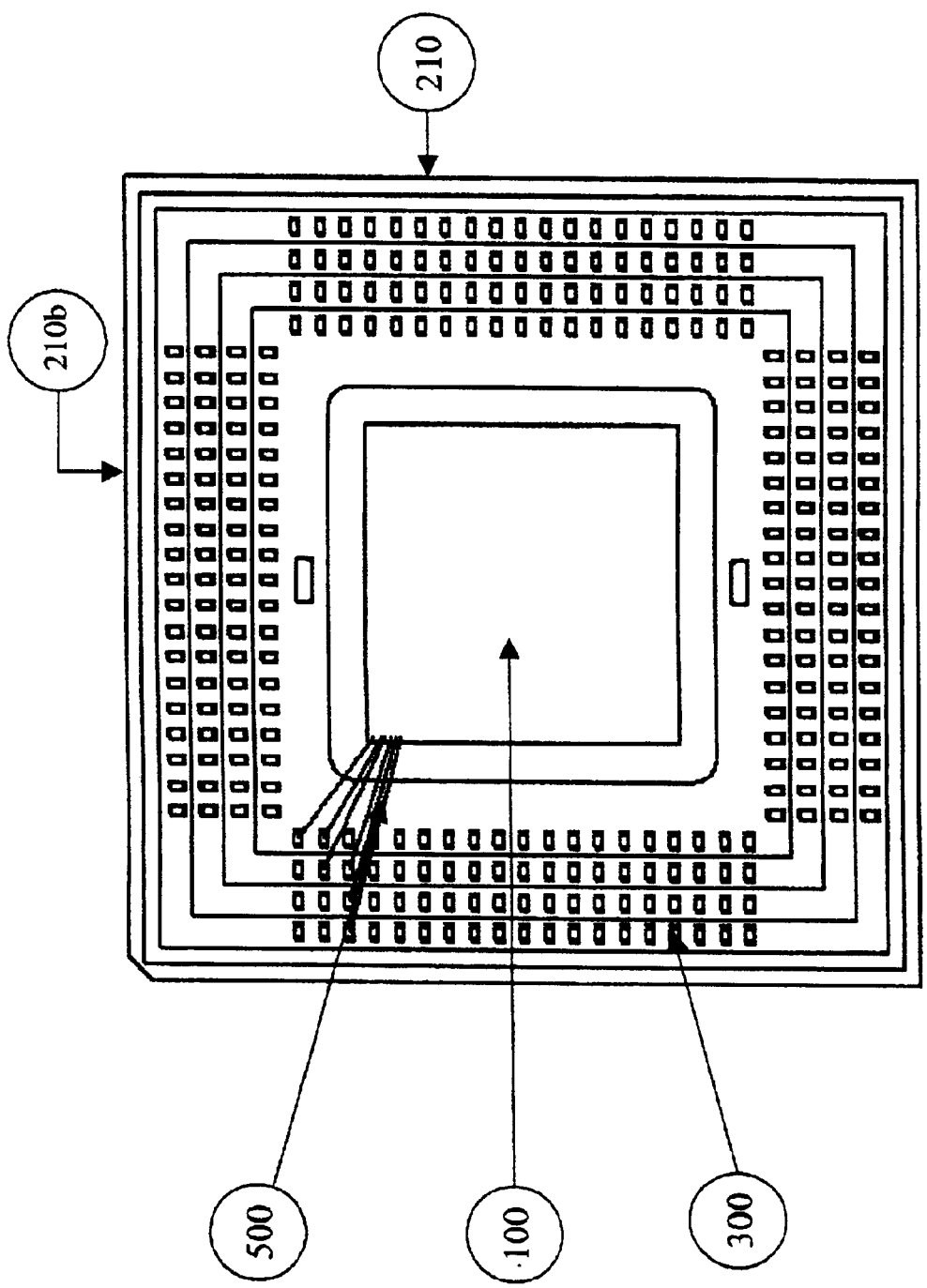
FIG. 16 depicts a bonding arrangement for use in the semiconductor die package of FIG. 1.

FIG. 16 illustrates one embodiment for electrically connecting a semiconductor die 100 to leads 300. Other arrangements may be used as well and the arrangement shown in FIG. 16 should not be considered to limit the present invention. Further, while FIG. 16 shows a single semiconductor die 100 mounted directly to end plate 220, it should be understood that multiple semiconductor dies 100 may be mounted within housing 200. Moreover, rather than direct mounting to the end plate 220, the semiconductor die(s) may be mounted to an intervening substrate, which may be electrically active, such as a ceramic substrate or circuit board. Housing 200 may also include one or more interconnect dies.

As shown in FIG. 16, electrically conductive material 500 is used to interconnect the leads 300 to bonding pads formed at the periphery of the semiconductor die 100. The electrically conductive material 500 may be, for example, wire bonding, tape automated bonding (TAB), conductive traces on insulated substrates, interconnect dies, and jumper wires, among others and/or a combination thereof. FIG. 16 shows the electrically conductive material 500 as a direct wire bonding between leads 300 and the semiconductor die 100. The electrically conductive material 500 preferably contacts the bonding surfaces 312 of the leads 300 to establish a good electrical connection.

FIG. 16 also shows the semiconductor die 100 centered on the end plate 220 of housing 200 with electrical connections that may be established according to known techniques. Alternatively, the semiconductor die 100 may not be centered when mounted within housing 200. The off-center die arrangement may be implemented for a die package 10 with leads extending from one or more side walls 210.

Some or all of these leads 300 may be electrically isolated and used solely to provide a stable mount to the printed circuit board or other substrate to which the package is mounted. For example, in FIG. 16 the leads 300 extending from top surface of side wall 210*b* are not electrically connected to the semiconductor die 100. One or more of the leads 300 may be connected to a ground plane, a power plane, or EMI or ESD shielding. Further, others of the leads 300 may be connected to the semiconductor die, either directly or indirectly.

Figure 17:
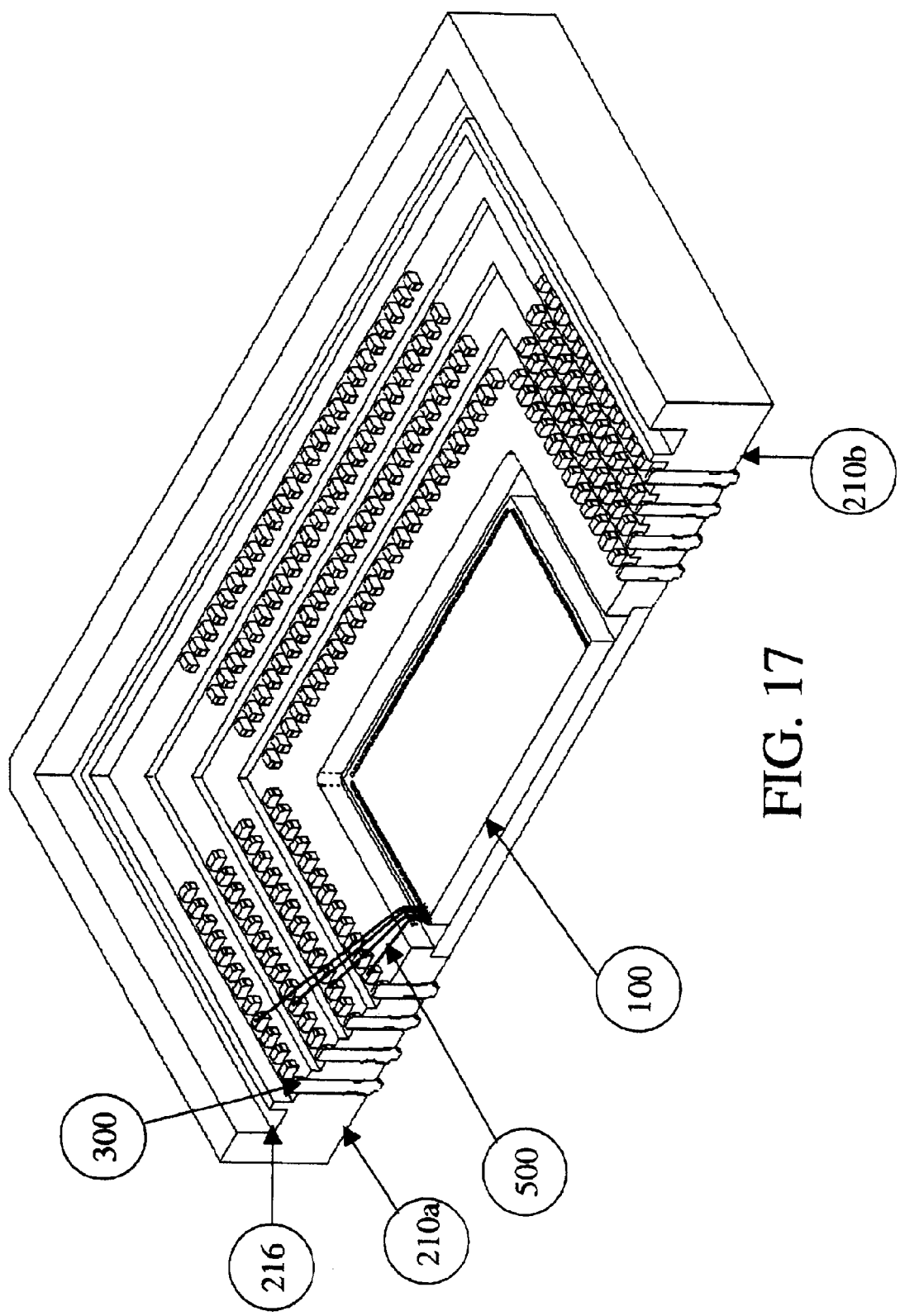
FIG. 17 illustrates a cross section of the semiconductor die package having a bonding arrangement as shown in FIG. 16.
Figure 18:
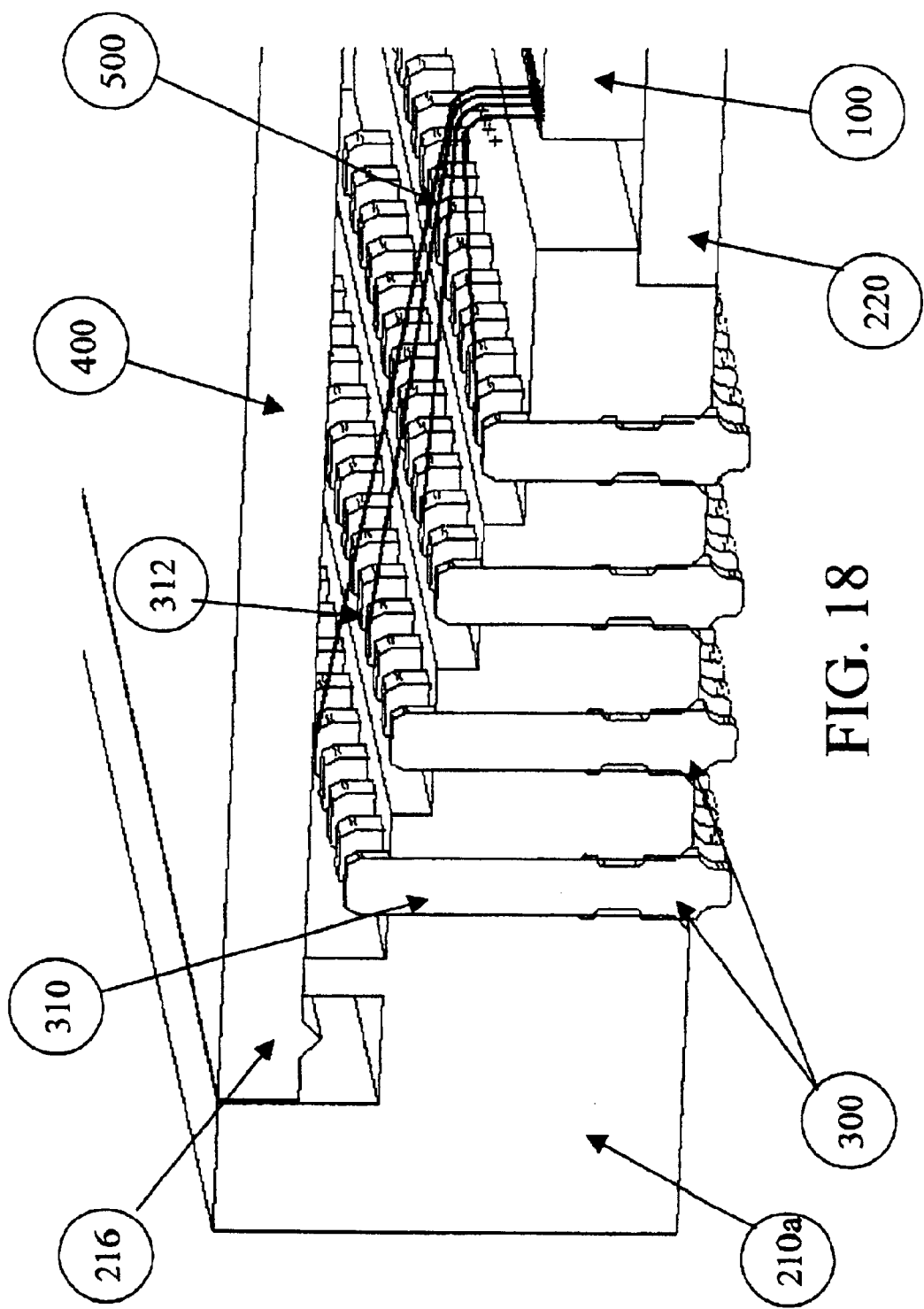
FIG. 18 shows a detailed view of the cross-sectional view of FIG. 17.

FIG. 17 illustrates a cross section of the semiconductor die package having the bonding arrangement shown in FIG. 16. FIG. 18 illustrates a close-up view of FIG. 17. As shown in FIG. 18, cover plate 400 seats within recess 216 at the top of side walls 210. The bonding surface 312 of the internal lead section 310 may be positioned below or above the active surface of the semiconductor die 100. Electrically conductive material 500 connects the internal lead section 310 of leads 300 to bonding pads on the semiconductor die 100. The external lead section of leads 300 extend from side walls 210*a* and 210*b* for surface mounting to a substrate, such as a printed circuit board.

After electrically connecting the semiconductor die(s) to the leads 300, an encapsulant may be used to seal all or a portion of the internal lead sections 310 of leads 300, the electrically conductive material 500, and all or a portion of the semiconductor die(s) to which the electrically conductive material is connected. In such a case, the encapsulant may bond to the portion of leads 300 that is exposed within the housing 200. After the semiconductor die(s) 100 are mounted to end plate 220 and electrically connected (e.g., wire bonded) to leads 300, the cover plate 400 is secured to the top of the housing 200. Alternatively, an encapsulant can be added to form a cover.

It will be apparent to those skilled in the art that various modifications and variations can be made in the micro grid array semiconductor die package of the present invention without departing from the spirit or scope of the invention. Thus, it is intended that the present invention cover the modifications and variations of this invention provided they come within the scope of the appended claims and their equivalents.

What is claimed is:

1. A semiconductor die package comprising:
    a housing defining a cavity for holding at least one semiconductor die, said housing including a plurality of insulative side walls, each of said side walls having a bottom surface and an inventor wall including a top surface, and an end plate joined to said side walls; and
    a plurality of substantially straight conductive leads extending through at least one of said side walls, each of said conductive leads including an internal lead section extending into the cavity from the top surface of the interior wall and an external lead section extending externally from said bottom surface of said side wall.

2. The semiconductor die package according to claim 1, wherein said side walls and end plate are a one-piece unit.

3. The semiconductor die package according to claim 1, wherein said insulative side walls are comprised of a liquid crystal polymer.

4. The semiconductor die package according to claim 1, wherein said side walls include a recess for receiving a cover plate.

5. The semiconductor die package according to claim 1.

6. The semiconductor die package according to claim 1, wherein said end plate comprises a conductive material.

7. The semiconductor die package according to claim 1, further comprising a cover plate that covers at least a portion of the cavity.

8. The semiconductor die package according to claim 7, wherein said side walls include a trench for receiving said cover plate.

9. The semiconductor die package according to claim 8, further comprising an adhesive applied to said trench for securing said cover plate to said housing.

10. The semiconductor die package according to claim 7, further comprising an adhesive applied to said side walls for securing said cover plate to said housing.

11. The semiconductor die package according to claim 1, wherein said external lead sections extend at least two different lengths from said at least one bottom surface of said side wall.

12. The semiconductor die package according to claim 1, wherein said conductive leads include external lead sections that only extend externally from the bottom surface of one or more said side walls.

13. A semiconductor die package comprising:
    a housing defining a cavity for holding at least one semiconductor die, said housing including a plurality of insulative side walls, each of said side walls having a bottom surface, wherein an interior surface of at least one side wall includes two or more ledges, each ledge having a top surface;
    an end plate joined to said side walls; and
    a plurality of substantially straight conductive leads extending through at least said two or more ledges, each of said conductive leads including an internal lead section extending into the cavity from the top surface of one of said ledges and an external lead section extending externally from said at least one bottom surface of said side wall.

* * * * *